US012587027B2

(12) United States Patent
Cois et al.

(10) Patent No.: US 12,587,027 B2
(45) Date of Patent: Mar. 24, 2026

(54) METHOD FOR CONTROLLING A CELL CURRENT LIMITING VALUE FOR A BATTERY MANAGEMENT SYSTEM, BATTERY MANAGEMENT SYSTEM

(71) Applicant: Robert Bosch GmbH, Stuttgart (DE)

(72) Inventors: Olivier Cois, Kernen (DE); Aleksandar Aleksandrov, Stuttgart (DE); Christoph Kroener, Freiberg am Neckar (DE); Jens Becker, Benningen am Neckar (DE); Melwin Pascal Watterott, Bissingen an der Teck (DE); Triantafyllos Zafiridis, Heilbronn (DE); Vincent Scharff, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 891 days.

(21) Appl. No.: 17/887,948

(22) Filed: Aug. 15, 2022

(65) Prior Publication Data

US 2023/0048538 A1     Feb. 16, 2023

(30) Foreign Application Priority Data

Aug. 16, 2021     (DE) .......................... 102021208939.9

(51) Int. Cl.
H02J 7/00            (2006.01)
B60L 58/25           (2019.01)
(Continued)

(52) U.S. Cl.
CPC ........ H02J 7/007194 (2020.01); B60L 58/25 (2019.02); G01R 19/02 (2013.01);
(Continued)

(58) Field of Classification Search
None
See application file for complete search history.

(56) References Cited

U.S. PATENT DOCUMENTS 9,035,621 B2     5/2015     Berkowitz et al.
9,413,189 B2     8/2016     Maleki et al.
(Continued)

FOREIGN PATENT DOCUMENTS

DE        102010003423 A1     10/2011

*Primary Examiner* — Jas A Sanghera
(74) *Attorney, Agent, or Firm* — Michael Best & Friedrich LLP

(57)            ABSTRACT

A method for controlling a cell current limiting value for a battery management system. In some examples, the method includes determining quadratic reference currents of a battery cell; calculating a corresponding reference time constant for each reference current using a model for the calculation of a RMS value of a cell current by reference to a continuous current; constituting a diagram for the relationship between the reference time constant and the quadratic reference current; determining a predictive time constant by the comparison of a quadratic measured value of a cell current with the quadratic reference currents; calculating a predictive RMS limiting value of the cell current; calculating a first predictive limiting value for a short predictive time, a second predictive limiting value for a long predictive time, and a third predictive limiting value for a continuous predictive time; and calculating additional RMS limiting value for the cell current.

10 Claims, 8 Drawing Sheets

(51) Int. Cl.

| | |
|---|---|
| *G01R 19/02* | (2006.01) |
| *G01R 31/396* | (2019.01) |
| *H01M 10/42* | (2006.01) |
| *H01M 10/44* | (2006.01) |
| *H01M 10/48* | (2006.01) |

(52) U.S. Cl.
CPC ........ *G01R 31/396* (2019.01); *H01M 10/425* (2013.01); *H01M 10/443* (2013.01); *H01M 10/486* (2013.01); *H02J 7/00309* (2020.01); *H02J 7/0047* (2013.01); *B60L 2240/545* (2013.01); *H01M 2010/4271* (2013.01); *H01M 2220/20* (2013.01)

(56) References Cited

U.S. PATENT DOCUMENTS

| | | | |
|---|---|---|---|
| 2020/0136173 A1 | 4/2020 | Hong et al. | |
| 2020/0212684 A1 | 7/2020 | Campbell et al. | |
| 2021/0249885 A1* | 8/2021 | Lim ..................... | G01R 31/382 |

\* cited by examiner

METHOD FOR CONTROLLING A CELL CURRENT LIMITING VALUE FOR A BATTERY MANAGEMENT SYSTEM, BATTERY MANAGEMENT SYSTEM

BACKGROUND OF THE INVENTION

The invention relates to a method for controlling a cell current limiting value for a battery management system.

The invention further relates to a battery management system, which is designed to execute the method according to the invention.

The invention also relates to a battery having one or more battery cells, which is designed to execute the method according to the invention and/or which comprises the battery management system according to the invention.

The invention further relates to a vehicle, which is designed to execute the method according to the invention, and/or which comprises the battery management system according to the invention and/or which comprises the battery according to the invention.

It is apparent that, in future, electrically-propelled motor vehicles will be employed to an increasing extent. In electrically-propelled motor vehicles of this type, such as e.g. hybrid vehicles and electric vehicles, rechargeable batteries are employed, predominantly for the supply of electrical energy to electric drive machines.

The RMS (root mean square) value of a current is relevant on the grounds of the risk of the overheating of components which are not directly monitored by a temperature sensor, such as e.g. a fuse or a relay, or the localized overheating of battery cells, and particularly the overheating of a current collector and the surrounding sealing material. Regular overheating of the sealing material can result in the leakage of the battery cell, which can then result in accelerated ageing. As this correlates directly to the power loss of battery cells ($P=Uloss \cdot I=R \cdot I^2$), this effect has a direct influence upon the available power, and can shorten the service life of the battery cell.

The object of the present invention is the calculation of a maximum permissible current in the charging and discharging device, in consideration of the heat-up of battery cells.

SUMMARY OF THE INVENTION

A method is proposed for controlling a cell current limiting value for a battery management system. The battery management system is designed for the monitoring and control of a battery. The battery can comprise one or more series- or parallel-connected battery cells. The battery cell is preferably configured in the form of a lithium-ion cell.

According to the invention, firstly, for a measured temperature $T_{sens}$, quadratic reference currents $i_{ref}^2$ are determined for a battery cell, for various time intervals $t_{ref}$. The reference current $i_{ref}$ represents the maximum permissible cell current at the measured temperature $T_{sens}$ for the corresponding time $t_{ref}$. For example, for a measured temperature of 25° C., quadratic reference currents $i_{ref2s}^2$, $i_{ref10s}^2$, $i_{ref30s}^2$ are determined for the corresponding times $t_{ref}$ of 2 s, 10 s and 30 s. If, for example, the temperatures defined in the cell data sheet are 20° C. and 30° C., these quadratic reference currents can be interpolated, if this is permitted by the cell data sheet.

Thereafter, for each reference current $i_{ref}$, a corresponding reference time constant $\tau_{ref}$ is determined using a model for the calculation of a RMS value $i_{RMS}$ of a cell current $i_{req}$, with reference to a continuous current $i_{cont}$, which corresponds to the minimum current in the charging or discharging device which causes no thermal damage. The main function of the model is the authorization of a specific current for the time interval considered, by reference to the cell data sheet. This model thus permits the modelling of the dynamic behavior of current limiting values. For example, if it proceeds from the cell data sheet that a current of 150 A is only permitted to last for 2 s, this current must only be permitted for 2 s or less. To this end, the reference time constant $\tau_{ref}$ is adjusted such that the limiting value for current occurs at 2 s or earlier. For example, for the respective reference currents $i_{ref2s}$, $i_{ref10s}$ and $i_{ref30s}$ a corresponding reference time constant $\tau_{ref2s}$, $\tau_{ref10s}$ and $\tau_{ref30s}$ is calculated.

With reference to the calculated reference time constants $\tau_{ref}$ and the quadratic reference currents $i_{ref}^2$ thus determined, a diagram is then constituted for the relationship between the reference time constant $\tau_{ref}$ and the quadratic reference current $i_{ref}^2$ for each specified temperature. This diagram can also be constituted for each specified state of charge.

Thereafter, a predictive time constant $\tau_{pred}$ is determined by the comparison of a quadratic measured value $i_{sens}^2$ of a cell current $i_{req}$ with the quadratic reference current $i_{ref}^2$. If the quadratic measured value $i_{sens}^2$ of the cell current $i_{req}$ is equal to a quadratic reference current $i_{ref}^2$, the predictive time constant $\tau_{pred}$ is equal to the reference time constant $\tau_{ref}$ which corresponds to this reference current $i_{ref}$. Otherwise, the predictive time constant $\tau_{pred}$ is determined by interpolation.

A predictive RMS limiting value $i_{pred}$ for the cell current $i_{req}$ is then calculated on the basis of the continuous current $i_{cont}$, a predictive time $t_{pred}$ and the predictive time constant $\tau_{pred}$. The predictive time can be customer-specific.

The reference current $i_{ref}$ and the duration $t_{ref}$ of the reference current $i_{ref}$ are cell-specific and temperature-dependent. These variables can be sourced directly from the cell data sheet, or obtained by measurements.

The model for the calculation of the RMS value $i_{RMS}$ is preferably configured in the form of a PT1-element, also described as a PT1-filter. A PT1-element is understood as a LTI (linear time-invariant) transmission element in control technology, which assumes a proportional transmission behavior with a time delay of the first order. A customary example is a low-pass of the $1^{st}$ order, which can be achieved, for example, by means of a RC-element. Advantageously, a PT1 element is simple to implement.

The method according to the invention is explained by reference to a model, which is preferably configured in the form of a PT1-element. The RMS value $i_{RMS}$ of a cell current $i_{req}$ is calculated as follows by a first equation:

$$i_{RMS}^2(t) = \left(1 - e^{-\frac{t}{\tau}}\right) \cdot i_{sens}^2(t) + i_{RMS0}^2 \cdot e^{-\frac{t}{\tau}} \tag{1}$$

Where $i_{RMS}(t)$ is the present RMS value of the cell current $i_{req}$, and is time-dependent, $i_{RMS0}$ is the initial RMS value of the cell current $i_{req}$, t is time, $\tau$ is the time constant of the PT1-element and $i_{sens}(t)$ is the measured value of the cell current $i_{req}$.

The RMS value $i_{RMS}(t)$ of the cell current $i_{req}$ is then calculated as follows by means of a second equation, with a continuous current $i_{cont}$, which is temperature-dependent:

$$i_{RMS}^2(t) \leq i_{cont}^2(T) \tag{2}$$

3

This continuous current $i_{cont}$ corresponds to the minimum current which causes no thermal damage, and can be sourced from the cell data sheet. The continuous current $i_{cont}$ is relevant to the limitation of the cell current $i_{req}$, and ensures that no overheating of the battery cell occurs. The value of the continuous current $i_{cont}$ is then reduced, in order to protect other components such as, for example, fuses and relays, against the generation of heat. The reduction in the value of the continuous current $i_{cont}$ can be based upon thermal measurement, or can be generated from a simulation.

Provided that $i_{RMS}^2(t)$ is equal to $i_{cont}^2$, a predictive RMS limiting value $i_{pred}$, which corresponds to the measured value $i_{sens}$ of the cell current $i_{req}$ in the first equation, can be calculated as follows by means of a third equation:

$$i_{pred}(t) = \sqrt{\frac{i_{cont}^2(T) - i_{RMS0}^2 \cdot e^{-\frac{t}{\tau}}}{1 - e^{-\frac{t}{\tau}}}} \tag{3}$$

Where T is the temperature of the battery cell.

For a specific temperature and a specific predictive time interval $t_{pred}$, such as, for example, 0.5 s, 2 s or 10 s, a new third equation can be derived as follows:

$$i_{pred}(t_{pred}) = \sqrt{\frac{i_{cont}^2 - i_{RMS0}^2 \cdot e^{-\frac{t_{pred}}{\tau}}}{1 - e^{-\frac{t_{pred}}{\tau}}}} \tag{3'}$$

In this case, a constant k is introduced. This constant k is defined as follows:

$$k = e^{-\frac{t_{pred}}{\tau}}$$

A simplified new third equation is thus derived from the new third equation as follows:

$$i_{pred}(t_{pred}) = \sqrt{\frac{i_{cont}^2 - i_{RMS0}^2 \cdot k}{1 - k}} \tag{3''}$$

The initial RMS value $i_{RMS0}$ can be obtained by means of the reference current $i_{ref}$ and the time $t_{ref}$ of the reference current $i_{ref}$, in the form of a step response, which is described as follows in a fourth equation:

$$i_{RMS0}^2(t_{ref}) = \left(1 - e^{-\frac{t_{ref}}{\tau}}\right) \cdot i_{ref}^2 \tag{4}$$

With reference to the simplified new third equation (3") and the fourth equation, the predictive RMS limiting value $i_{pred}$ for a specific predictive time interval $t_{pred}$ is calculated as follows by means of a fifth equation:

$$i_{pred}^2(t_{pred}) = \frac{i_{cont}^2 - \left(1 - e^{-\frac{t_{ref}}{\tau}}\right) \cdot i_{ref}^2 \cdot k}{1 - k} \tag{5}$$

4

Provided that $i_{pred}^2(t_{pred})$ is equal to $i_{ref}^2$, the time constant $\tau$ is derived as follows by means of a sixth equation:

$$\tau = \frac{-t_{ref}}{\ln\left(\frac{i_{ref}^2 - i_{cont}^2}{k \cdot i_{ref}^2}\right)} \tag{6}$$

A time constant $\tau$ is thus calculated for each specified maximum permissible cell current $i_{ref}$ and the specified time $t_{ref}$. By means of the sixth equation, a new time constant $\tau$ can be calculated for each specified temperature, which is adjusted according to the measured value $i_{sens}$ of the cell current $i_{req}$.

The quadratic measured value $i_{sens}^2$ of the cell current $i_{req}$ is compared with the quadratic reference current $i_{ref}^2$ for a specific temperature T and a specific time $t_{ref}$, in order to derive an appropriate predictive time constant $\tau_{pred}$.

If, for example, the quadratic measured value $i_{sens}^2$ of the cell current $i_{req}$ is equal to the quadratic cell current $i_{ref2s}^2$ for a time $t_{ref}$ of 2 s, a predictive time constant $\tau_{pred}$ can be calculated by means of the sixth equation. The time constant $\tau_{pred}$ is equal to the reference time constant $\tau_{ref2s}$ for the reference current $i_{ref2s}$ for a time $t_{ref}$ of 2 s. The reduction of the cell current $i_{req}$ then commences after 2 s.

Determination of the predictive time constant $\tau_{pred}$ is preferably executed by linear interpolation. The time constant $\tau_{pred}$ is thus dynamic, and is adjusted according to the measured value $i_{sens}$ of the cell current $i_{req}$.

If, for example, the quadratic measured value $i_{sens}^2$ of the cell current $i_{req}$ is greater than the quadratic reference current $i_{ref10s}^2$ for a time $t_{ref}$ of 10 s, but is smaller than the quadratic reference current $i_{ref2s}^2$ for a time $t_{ref}$ of 2 s, a predictive time constant $\tau_{pred}$ can be determined by linear interpolation between the reference time constant $\tau_{ref2s}$ for the reference current $i_{ref2s}$ for a time $t_{ref}$ of 2 s and the reference time constant $\tau_{ref10s}$ for the reference current $i_{ref10s}$ for a time $t_{ref}$ of 10 s.

By means of the predictive time constant $\tau_{pred}$ thus determined and the third equation, a predictive RMS limiting value $i_{pred}$ can be calculated.

Preferably, an additional point $[i_{min}; \tau_{relax}]$ is inserted in the diagram for the relationship between the reference time constant $\tau_{ref}$ and the reference current $i_{ref}$. This point is inserted in order to define a relaxation time constant $\tau_{relax}$ for the battery cell in a relaxed or quasi-relaxed state. Thus, $i_{min}$ represents a small current, at which no loading of the cell occurs. This small current $i_{min}$ can be a small charging current or discharge current. By means of this definition, a small relaxation time constant $\tau_{relax}$ can be selected, for example, in order to permit a high recuperation current. This new point can be dependent upon the temperature T.

Preferably, on the basis of the predictive RMS limiting value $i_{pred}$, a first predictive limiting value $i_{predS}$ for a short predictive time $t_{predS}$, a second predictive limiting value $i_{predL}$ for a long predictive time $t_{predL}$ and a third predictive limiting value $i_{predP}$ for a continuous predictive time $t_{predP}$ are calculated. For example, a time of less than 2 s can be defined as a short predictive time $t_{predS}$. For example, a long predictive time $t_{predL}$ can be equal to 2 s, whereas a continuous predictive time $t_{predP}$ can be equal to 10 s. These predictive times can be customer-specific. In general, these predictive times are fixed values. The predictive time $t_{pred}$ corresponds to those time periods during which a constant current can be employed, with no limitation executed by the battery management system. This constant current can be employed, for example, for the calculation of the third predictive limiting value $i_{predP}$.

$$k = e^{-\frac{t_{pred}}{\tau}}$$

Preferably, the constant employed in the calculation of the first predictive limiting value $i_{predS}$ is established for a short predictive time $t_{predS}$. By the establishment of the constant k and the variation of the time constant $\tau$, the first predictive limiting value $i_{predS}$ is also dynamic, as it adjusts to the present thermal loading of the battery cell.

For the calculation of the second predictive limiting value $i_{predL}$ and the third predictive limiting value $i_{predP}$, two conditions are to be fulfilled.

Firstly:

$$k_S \geq k_L(T) \geq k_P(T)$$

Where $k_S$ is the constant $$k = e^{-\frac{t_{pred}}{\tau}}$$

for the first predictive limiting value $i_{predS}$, which is a fixed value, $k_L(T)$ is the constant $$k = e^{-\frac{t_{pred}}{\tau}}$$

for the second predictive RMS limiting value $i_{predL}$ and $k_P(T)$ is the constant $$k = e^{-\frac{t_{pred}}{\tau}}$$

for the third predictive limiting value $i_{predP}$. The constants $k_L(T)$ and $k_P(T)$ are temperature-dependent.

Secondly, if the PT1-element is equal to zero, it is required that the second predictive limiting value $i_{predL}$ for a long predictive time $t_{predL}$ should represent the reference current $i_{ref}$ for this long predictive time $t_{predL}$ and for the present temperature of the battery cell. By "PT1-element is equal to zero", it is to be understood that the RMS value $i_{RMS}$ of the charging current $i_{req}$ is equal to zero. The constant $k_L(T)$ for the second predictive limiting value $i_{predL}$ is defined as follows:

$$k_L(T) = e^{-\frac{t_{predL}}{\tau_{predL(T)}}}$$

In consideration of these two conditions, the constant $k_L$ and a long predictive time constant $\tau_{predL}(T)$ for the second limiting value $i_{predL}$ are calculated as follows by means of a seventh and eighth equation:

$$k_L(T) = 1 - \frac{i_{cont}^2(T)}{i_{ref,predL}^2(T)} \tag{7}$$

$$\tau_{predL}(T) = -\frac{t_{predL}}{\ln(k_L(T))} \tag{8}$$

Where $i_{cont}(T)$ is the continuous current corresponding to the minimum current which causes no thermal damage, and can be sourced from the cell data sheet. $i_{ref,predL}$ is the reference current $i_{ref}$ for this long predictive time $t_{predL}$.

The second predictive limiting value $i_{predL}$ is then calculated as follows by means of a ninth equation, which is derived from the third equation:

$$i_{predL}(t) = \sqrt{\frac{i_{cont}^2(T) - i_{RMS0}^2 \cdot e^{-\frac{t_{predL}}{\tau_{predL(T)}}}}{1 - e^{-\frac{t_{predL}}{\tau_{predL(T)}}}}} \tag{9}$$

Calculation of the third predictive limiting value $i_{predP}$ is subject to the same conditions as those applied to the calculation of the second predictive limiting value $i_{predL}$. Thus, $k_L(T) \geq k_P(T)$. Accordingly, the third predictive limiting value $i_{predP}$ can be calculated as follows by means of a tenth equation:

$$i_{predP}(t) = \sqrt{\frac{i_{cont}^2(T) - i_{RMS0}^2 \cdot e^{-\frac{t_{predP}}{\tau_{predP(T)}}}}{1 - e^{-\frac{t_{predL}}{\tau_{predP(T)}}}}} \tag{10}$$

Where $\tau_{predP}(T)$ is the continuous predictive time constant for the third predictive limiting value $i_{predP}$.

Preferably, an additional RMS limiting value $i_{limT}$ for the cell current $i_{req}$ is calculated by reference to a maximum permissible temperature $T_{max}$ of the battery cell and the measured temperature $T_{sens}$ of the battery cell. This additional RMS limiting value $i_{limT}$ is employed for thermal derating, which is generally understood as a reduction in current for the limitation of a rise in temperature. The continuous current $i_{cont}$ is limited by the additional RMS limiting value lima, and is reduced in the event of thermal derating.

The additional RMS limiting value $i_{limT}$ is derived from the following equation:

$$mC_p \frac{dT}{dt} = R \cdot i^2 + \alpha_{env} \cdot A \cdot (T_{env} - T) + \alpha_{Cool} \cdot A \cdot (T_{Cool} - T)$$

Where m is the mass of a battery cell in kg, $C_p$ is the thermal capacitance in J/K, R is the internal resistance of the battery cell in ohms, i is the cell current in A, $\alpha_{env}$ is the heat transfer coefficient with the environment, $T_{env}$ is the ambient temperature in K, $\alpha_{Cool}$ is the heat transfer coefficient with the cooling system, $T_{Cool}$ is the cooling temperature in K, and A is the heat transfer surface area in $m^2$.

In consideration of an extreme case, wherein no additional temperature sensors are present for the detection of $T_{env}$ and $T_{Cool}$, the above-mentioned equation is rewritten as follows:

$$mC_p \frac{dT}{dt} = R \cdot i^2$$

By the application of the finite-difference method, this equation is further rewritten as follows:

$$mC_p \frac{T_{max} - T_{sens}}{\Delta t} = R \cdot i^2$$

The additional RMS limiting value $i_{limT}$ can be derived as follows from an eleventh equation:

$$i_{limT} = \sqrt{\frac{K_p}{R} \cdot (T_{max} - T_{sens}) + K_i \cdot \int (T_{max} - T_{sens}) \cdot dt} \qquad (11)$$

where $$K_p = \frac{mC_p}{\Delta t}$$

is a proportional amplifier and $$K_i = \frac{K_p}{\tau_T}$$

is an integral amplifier.

The thermal time constant $\tau_T$ is defined as follows:

$$\tau_T = \frac{mC_p}{K_{env} + K_{Cool}}$$

where $K_{env} = \alpha_{env} \cdot A$ and $K_{Cool} \cdot A$. $K_{env}$ and $K_{Cool}$ are constant.

This gives the following:

$$K_i = \frac{K_{env} + K_{Cool}}{\Delta t}$$

Preferably, a proportional-integral controller (PI controller), having a proportionally-acting component (P-component) and an integrally-acting component (I-component), is employed. The PI controller is employed for thermal derating. The mathematical structure of the PI controller can also be described by the eleventh equation. Calibration of the proportional amplifier $k_p$ and the integral amplifier $k_i$ can be based upon equations from a thermal model. Advantageously, rapid calibration can be executed on the basis of physical parameters. This PI controller influences the continuous current $i_{cont}$ and thus the predictive RMS limiting value $i_{pred}$.

By means of the PI controller, a maximum current can be established which reduces the difference between the maximum permissible temperature $T_{max}$ and the measured temperature $T_{sens}$. The P-component delivers an initial evaluation of the maximum current, whereas the I-component enhances the accuracy of evaluation, and reduces the margin between the maximum permissible temperature $T_{max}$ and the measured temperature $T_{sens}$.

The proportional-integral controller preferably comprises an anti-windup structure. Additionally or alternatively, the integrally-acting component of the proportional-integral controller can be activated only in the event that the measured temperature $T_{sens}$ exceeds the maximum permissible temperature $T_{max}$ and/or if the measured temperature $T_{sens}$ exceeds a predefined temperature threshold value and the RMS value $i_{RMS}$ of the cell current $i_{req}$ exceeds a predefined current threshold value. Preferably, the I-component of the PI controller is only activated in critical cases, for example where the temperature T is already high. Otherwise, the I-component of the PI controller can be deactivated. For example, at a temperature T of 25° C., there is no risk of a high temperature, such that the I-component is deactivated.

For the purposes of control, the present temperature is firstly measured. Thereafter, the additional RMS limiting value $i_{limT}$ is calculated by the PI controller. The continuous current $i_{cont}$ is then reduced, if the additional RMS limiting value $i_{limT}$ is smaller than the continuous current $i_{cont}$. The predictive RMS limiting value $i_{pred}$ is adjusted thereafter. These control steps are repeated, such that the predictive RMS limiting value $i_{pred}$ adjusted dynamically. During control, in all cases, a calculation of the predictive RMS limiting value $i_{pred}$ and/or of the first, second and third predictive limiting values $i_{predS}$, $i_{predL}$, $i_{predP}$ is executed, which is transmitted to a bus system, for example a CAN-bus. The measured value $i_{sens}$ the cell current $i_{req}$ is thus detected.

A battery management system is further proposed, which is designed to execute the method according to the invention.

A battery having one or more battery cells is also proposed, which is designed to execute the method according to the invention, and/or which comprises the battery management system according to the invention.

A vehicle is further proposed, which is designed to execute the method according to the invention, and/or which comprises the battery management system according to the invention and/or the battery according to the invention.

Advantages of the Invention

By means of the present invention, an algorithm can be efficiently implemented in a battery management system, which limits the current in accordance with the cell specifications, and thus ensures the full availability of capacity and the thermal protection of battery cells and components.

Data from battery cells are directly employed for the calculation of a time constant. By means of the method according to the invention, the RMS value of the cell current and the RMS limiting value of the cell current can be calculated. These variables are advantageous, firstly for the detection of potential premature ageing in battery cells, and secondly for the adjustment of a power strategy and a driving strategy for a vehicle.

The employment of a proportional-integral controller ensures that any static error between the maximum permissible temperature and the measured temperature is eliminated. The maximum power within a permissible temperature range is achieved accordingly.

The method according to the invention moreover permits the determination of a stress level, for the quantification of cell utilization and rapid calibration.

The method according to the invention moreover permits the calculation of a RMS value of the cell current, which can be employed as a measure of battery loading. This mean value of the charging current can be recorded, as a means of visualizing the stress level of the cell.

Moreover, implementation of the method according to the invention is efficient, as only a limited RAM is required for the processors of the battery management system.

The method is also flexible in operation. The predictive time horizon or predictive time interval can thus be varied, according to the requirements of a customer.

By means of the method according to the invention, more intelligent control is executed, thus permitting the battery system to deliver more power.

BRIEF DESCRIPTION OF THE DRAWINGS

Embodiments of the invention are described in greater detail with reference to the drawings and the following description.

In the drawings.

In the following description of embodiments of the invention, identical or similar elements are identified by the same reference symbols, wherein any repeated description of these elements in individual cases is omitted. The figures represent the subject matter of the invention in a schematic manner only.

DETAILED DESCRIPTION

Figure 1:
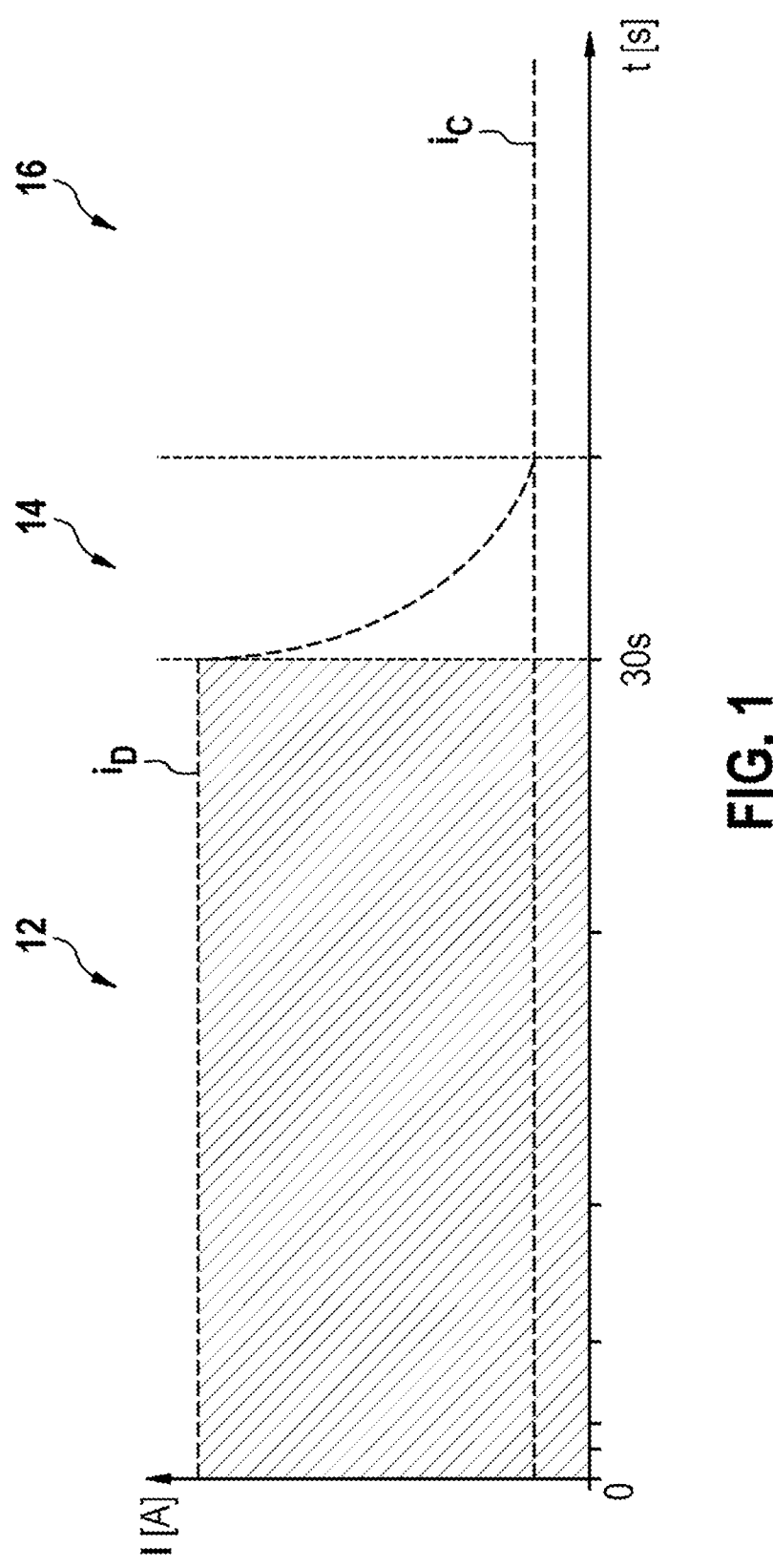
FIG. 1 shows a schematic representation of the anticipated behavior of a cell current limiting value.
Figure 3:
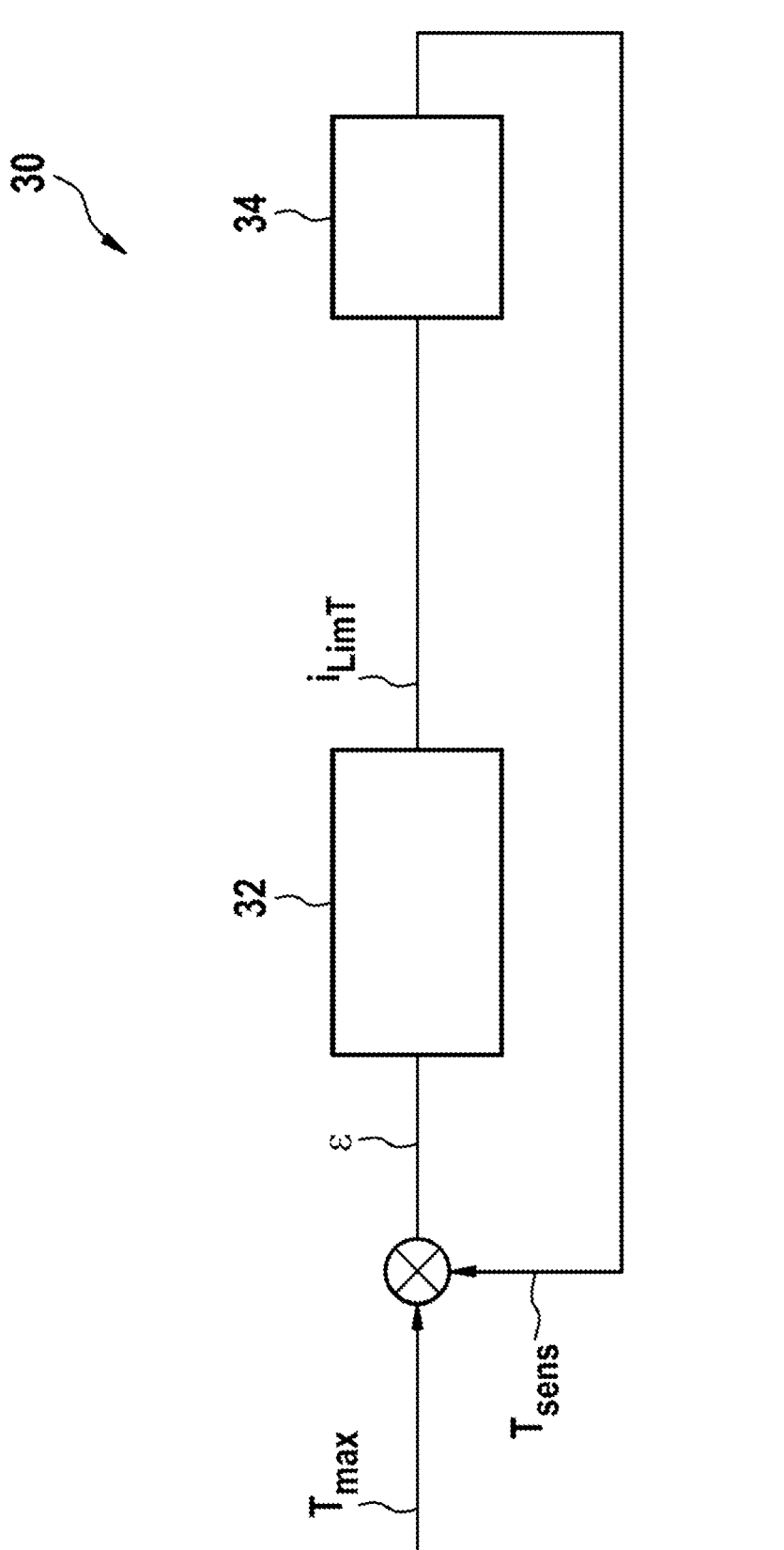
FIG. 3 shows a block circuit diagram of a control loop.

FIG. 1 shows a schematic representation of the anticipated behavior of a cell current limiting value of a battery cell 34 (see FIG. 3). It is anticipated that, by the employment of dynamic limiting values $i_D$ in a battery management system for the monitoring and control of the battery cell 34, the initial value of a cell current $i_{req}$, in a first phase 12 of duration, for example, 30 s, is not reduced, and these limiting values are converged in a second phase 14 thereafter to constitute continuous limiting values $i_C$. In a third phase 16, the cell current $i_{req}$ is then limited by the continuous limiting values $i_C$.

Figure 2:
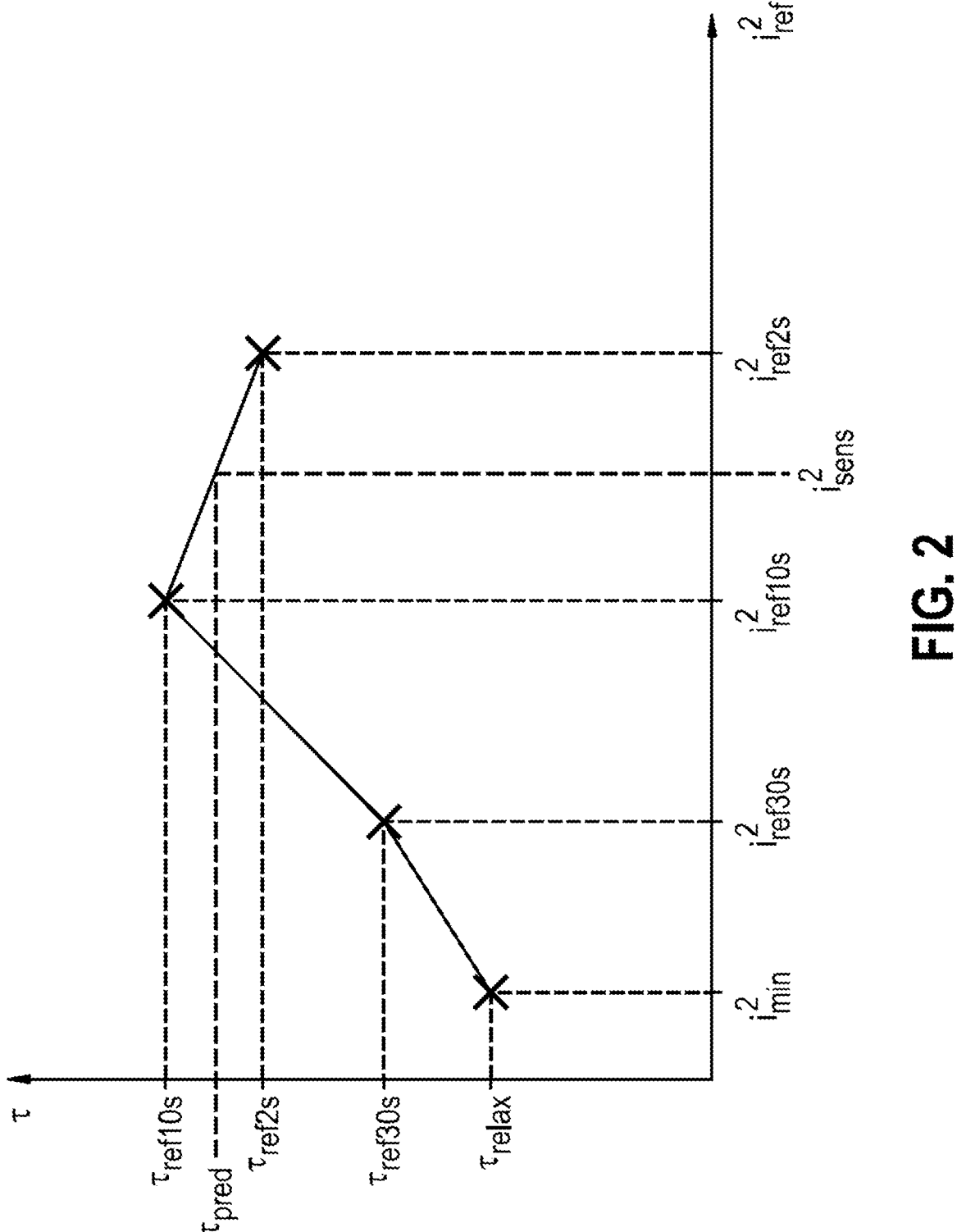
FIG. 2 shows a schematic representation of a diagram for determining a predictive time constant $\tau_{pred}$.

FIG. 2 shows a schematic representation of a diagram for the calculation of a predictive time constant $\tau_{pred}$. This diagram is clarified hereinafter with reference to a model for the calculation of a RMS value $i_{RMS}$ of a cell current $i_{req}$ using a PT1-element.

As described above, a time constant $\tau$ is calculated for each specific reference current $i_{ref}$, a specific time interval $t_{ref}$ and a specific temperature T. In the present case, in FIG. 2, for a specific temperature T, a reference time constant $\tau_{ref30s}$ for a reference current $i_{ref30s}$ of duration 30 s, a reference time constant $\tau_{ref10s}$ for a reference current $i_{ref10s}$ of duration 10 s and a reference time constant $\tau_{ref2s}$ for a reference current $i_{ref2s}$ of duration 2 s are calculated.

By means of these data, a diagram is plotted for the relationship between the time constant $\tau$ and the quadratic reference current $i_{ref}^2$ in FIG. 2.

The quadratic measured value $i_{sens}$ the cell current $i_{req}$ is compared with the quadratic reference current $i_{ref}^2$ for a specific time interval $t_{ref}$, in order to derive an appropriate predictive time constant $\tau_{pred}$.

If, for example, the quadratic measured value $i_{sens}$ of the cell current $i_{req}$ is equal to the quadratic reference current $i_{ref2s}^2$, a predictive time constant $\tau_{pred}$ is calculated which is equal to the reference time constant $\tau_{ref2s}$ which has been calculated for the reference current $i_{ref2s}$. The reduction of the cell current $i_{req}$ then commences after 2 s.

If, for example, the quadratic measured value $i_{sens}$ of the cell current $i_{req}$ is greater than the quadratic reference current $i_{ref10s}^2$, but is smaller than the quadratic reference current $i_{ref2s}^2$, a predictive time constant $\tau_{pred}$ is determined by linear interpolation between the reference time constant $\tau_{ref10s}$ and the reference time constant $\tau_{ref2s}$.

Moreover, in the diagram according to FIG. 2, an additional point $[i_{min}^2; \tau_{relax}]$ is inserted. This point is inserted, in order to define a relaxation time constant $\tau_{relax}$ for the battery cell 34 in a relaxed or quasi-relaxed state. Thus, $i_{min}$ represents a small current. By means of this definition, a small relaxation time constant $\tau_{relax}$ can be selected in order to permit, for example, a high recuperation current. This new point can thus be dependent upon the temperature T.

FIG. 3 shows a block circuit diagram of a control loop 30 for the control of the battery cell 34. The control loop 30 comprises a proportional-integral controller 32 for controlling the battery cell 34. The temperature T of the battery cell 34, designated as the measured temperature $T_{sens}$ is measured, and is compared with a maximum permissible temperature $T_{max}$ of the battery cell 34. The difference ε between the measured temperature $T_{sens}$ and the maximum permissible temperature $T_{max}$ is transmitted to the proportional-integral controller 32 as an input value. The proportional-integral controller 32, by reference to the difference ε, calculates an additional RMS limiting value $i_{limT}$ of the cell current $i_{req}$ as an output value.

For the purposes of control, the present temperature T is firstly measured. Thereafter, the additional RMS limiting value $i_{limT}$ is calculated by the proportional-integral controller 32. The continuous current $i_{cont}$ is then reduced, if the additional RMS limiting value $i_{limT}$ is smaller than the continuous current $i_{cont}$. The predictive RMS limiting value $i_{pred}$ adjusted thereafter. These is control steps are repeated, such that the predictive RMS limiting value $i_{pred}$ adjusted dynamically.

Figures 4A, 4B, 4C, 4D:
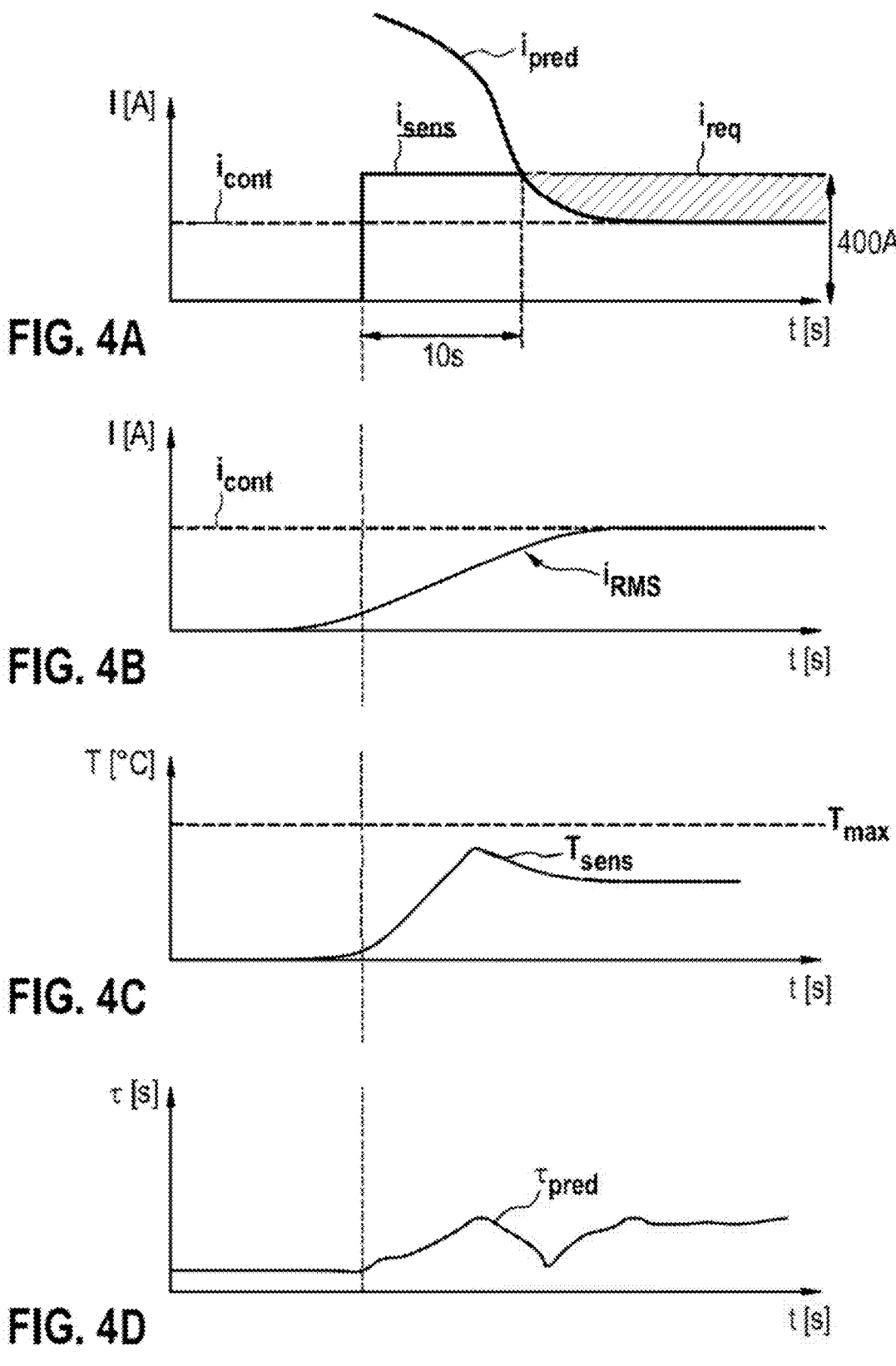
FIG. 4A shows a schematic representation of a temporal characteristic of a predictive RMS limiting value $i_{pred}$.
FIG. 4B shows a schematic representation of a temporal characteristic of a RMS value $i_{RMS}$ of the cell current $i_{req}$ according to FIG. 4A.
FIG. 4C shows a schematic representation of a temperature characteristic of a measured temperature $T_{sens}$ of the battery cell according to 4A.
FIG. 4D shows a schematic representation of a temporal characteristic of a predictive time constant $\tau_{pred}$ according to FIG. 4A.

FIG. 4A shows a schematic representation of a temporal characteristic of a predictive RMS limiting value $i_{pred}$. A measured values $i_{sens}$ of a cell current $i_{req}$ of 400A is detected. A cell current $i_{req}$ of 400A is only permissible for a time of 10 s, without causing thermal damage. A is predictive RMS limiting value $i_{pred}$ thus calculated by the method proposed according to the invention. Reduction of the cell current $i_{req}$ then commences after 10 s. The predictive RMS limiting value $i_{pred}$ ultimately converges to a continuous current $i_{cont}$, which corresponds to the maximum permissible continuous cell current $i_{req}$.

FIG. 4B shows a schematic representation of a temporal characteristic of a RMS value $i_{RMS}$ of the cell current $i_{req}$ according to FIG. 4A, whereas FIG. 4C shows a schematic representation of a temporal characteristic of a measured temperature $T_{sens}$ of the battery cell 34 according to FIG. 4A, and FIG. 4.4 shows a schematic representation of a temporal characteristic of a predictive time constant $\tau_{pred}$ according to FIG. 4A. From FIG. 4D, it can be seen that the predictive time constant $\tau_{pred}$ is adjusted according to the measured value $i_{sens}$ of the cell current $i_{req}$ and the measured temperature $T_{sens}$.

Figures 5A, 5B, 5C, 5D:
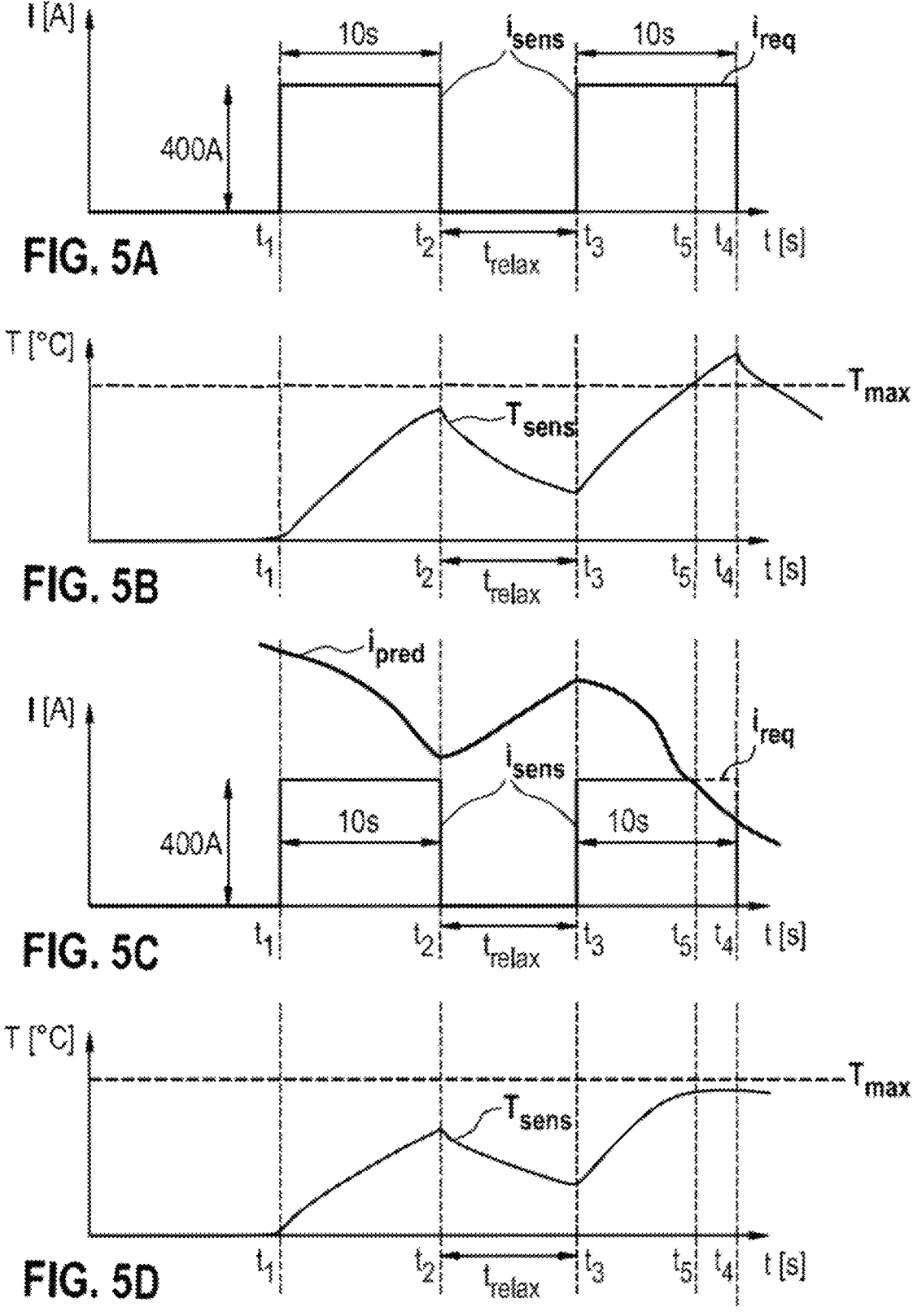
FIG. 5A shows a schematic representation of a temporal characteristic of a cell current $i_{req}$, with no limitation of the RMS value $i_{RMS}$ thereof.
FIG. 5B shows a schematic representation of a temporal characteristic of a measured temperature $T_{sens}$ of the battery cell according to 5A.
FIG. 5C shows a schematic representation of a temporal characteristic of a cell current $i_{req}$, with limitation of the RMS value $i_{RMS}$ thereof.
FIG. 5D shows a schematic representation of a temporal characteristic of a measured temperature $T_{sens}$ of the battery cell according to FIG. 5C.

FIG. 5A shows a schematic representation of a temporal characteristic of a cell current $i_{req}$, with no limitation of the RMS value $i_{RMS}$ thereof. The cell current $i_{req}$ is pulse-shaped, and comprises two current pulses with equal measured values $i_{sens}$ of 400A. The duration of the respective current pulses is 10 s. At time $t_1$, a first current pulse is transmitted, and the first current pulse ends at time $t_2$. At time $t_3$, a second current pulse is transmitted, and the second current pulse ends at time $t_4$. FIG. 5B shows a schematic representation of a temporal characteristic of a measured temperature $T_{sens}$ of the battery cell 34 according to FIG. 5A. The measured temperature $T_{sens}$ rises during the duration of the first current pulse, and falls during an intermediate time period, which is also described as the relaxation time $t_{relax}$, between the two current pulses, i.e. between the time points $t_2$ and $t_3$. The measured temperature $T_{sens}$ rises again during the duration of the second current pulse and, at a time point $t_5$, exceeds the maximum permissible temperature $T_{max}$.

FIG. 5C shows a schematic representation of a temporal characteristic of a cell current $i_{req}$, with the limitation of the RMS value $i_{RMS}$ thereof, whereas FIG. 5D shows a schematic representation of a temporal characteristic of a measured temperature $T_{sens}$ of the battery cell 34 according to FIG. 5C. The predictive RMS limiting value $i_{pred}$ is calculated. The two current pulses represented in FIG. 5C are equal to the current pulses in FIG. 5A. From FIG. 5C, it can be seen that the cell current $i_{req}$, with effect from time point $t_5$, is limited by the first predictive RMS limiting value $i_{pred}$. Accordingly, the measured temperature $T_{sens}$ does not exceed the maximum permissible temperature $T_{max}$. The relaxation effect of the battery cell 34 is also exploited. From FIG. 5C it can further be seen that, in the relaxation time $t_{relax}$, the predictive RMS limiting value $i_{pred}$ rises again, thus permitting a larger current pulse. A cell must be stress-relieved or relaxed, before a further current pulse can be delivered at the maximum permissible capacity. In a resting cell, the measured voltage corresponds to the no-load voltage uocv of the cell. For this reason, it is important that a sufficiently long relaxation time $t_{relax}$ should be incorporated, in order to permit the second current pulse. This relaxation time $t_{relax}$ corresponds to the time required for the measured voltage to achieve the no-load voltage of the cell. It will then be possible to set the maximum power, with no risk of thermal damage. This parameter can vary, according to the temperature T and the current strength of the previously employed pulse.

Figures 6A, 6B, 6C:
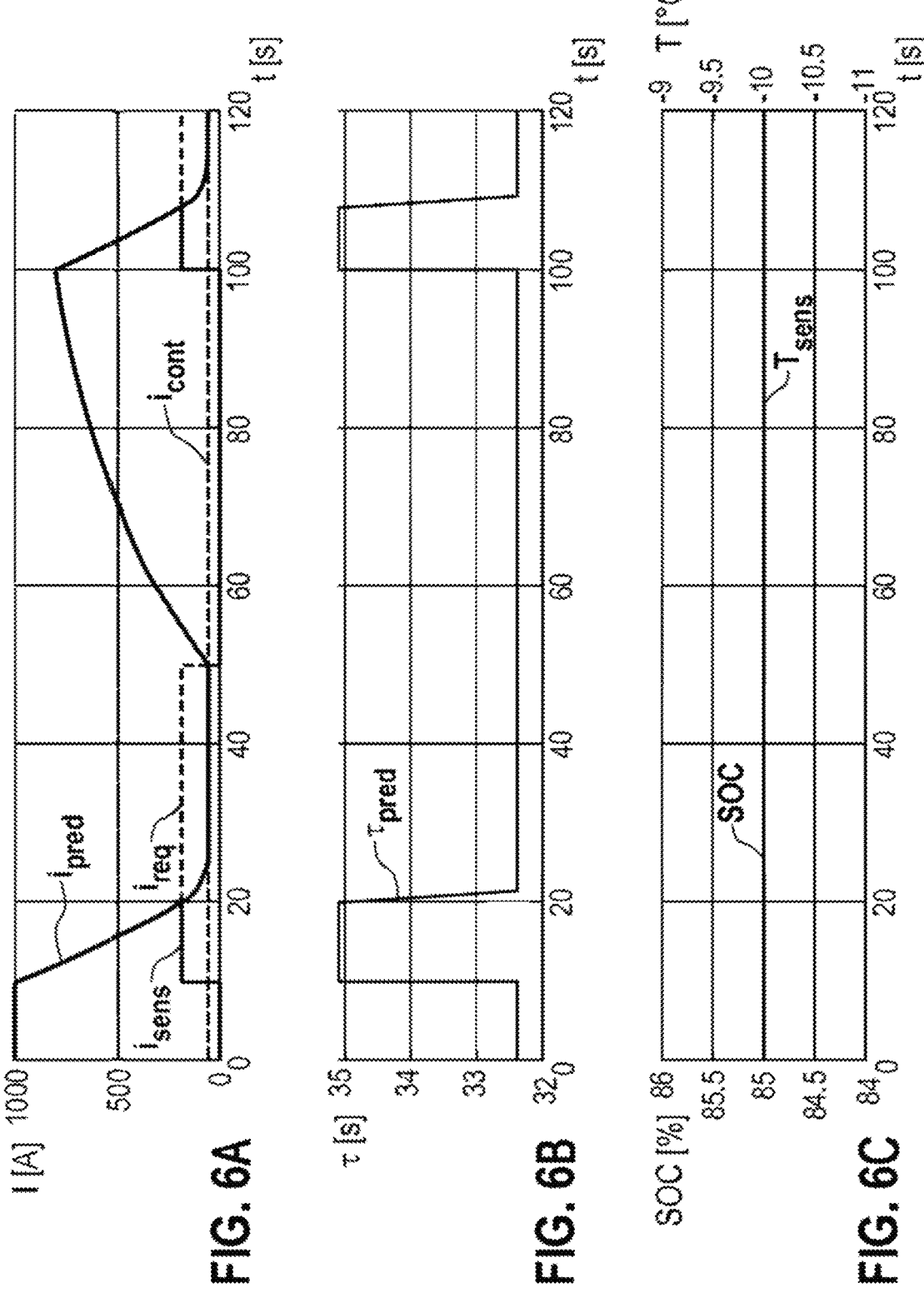
FIG. 6A shows a schematic representation of a temporal characteristic of a cell current $i_{req}$, with limitation of the RMS value $i_{RMS}$ thereof, according to a first example.
FIG. 6B shows a schematic representation of a temporal characteristic of a predictive time constant $\tau_{pred}$ according to FIG. 6A.
FIG. 6C shows a schematic representation of a temporal characteristic of a state of charge SOC and a temporal characteristic of a measured temperature $T_{sens}$ according to FIG. 6A.

FIG. 6A shows a schematic representation of a temporal characteristic of a cell current $i_{req}$, with limitation of the RMS value $i_{RMS}$ thereof, according to a first example, whereas FIG. 6B shows a schematic representation of a temporal characteristic of a predictive time constant $\tau_{pred}$ according to FIG. 6A, and FIG. 6C shows a schematic representation of a temporal characteristic of a state of charge SOC and a temporal characteristic of a measured temperature $T_{sens}$ according to FIG. 6A.

Temporal characteristics of a relaxed battery cell 34 are represented having an initial state of charge SOC of 85%. An initial temperature T of the battery cell 34 is –10° C. The battery cell 34 is thus charged with a cell current $i_{req}$ of 175 A for a time of 30 s. The state of charge SOC and the measured temperature $T_{sens}$ remain unchanged.

From FIG. 6A, it can be seen that, at time point t=10 s, a first current pulse, which represents the cell current $i_{req}$, having a measured value $i_{sens}$ of 175 A, is transmitted to the battery cell 34. The duration of the first current pulse is 30 s. From the data sheet for the battery cell 34, it can be determined that a current pulse of 175 A at a temperature T of –10° C. and a state of charge SOC of 85% is only permissible for 10 s. A predictive time constant $T_{pred}$ and a predictive RMS limiting value $i_{pred}$, which converge to a continuous current $i_{cont}$, are calculated. From FIG. 6A, it can further be seen that, at time point t=20 s, i.e. after 10 s following the transmission of the first current pulse, the reduction of the first current pulse commences. The first current pulse is reduced to the continuous current $i_{cont}$. Only at the end of the first current pulse does the predictive RMS limiting value $i_{pred}$ begin to rise again, in order to permit a further current pulse. At time point t=100 s, a second current pulse, which is equal to the first current pulse, is transmitted to the battery cell 34. Given the loaded state of the battery cell 34, reduction of the second current pulse commences earlier.

Figures 7A, 7B, 7C:
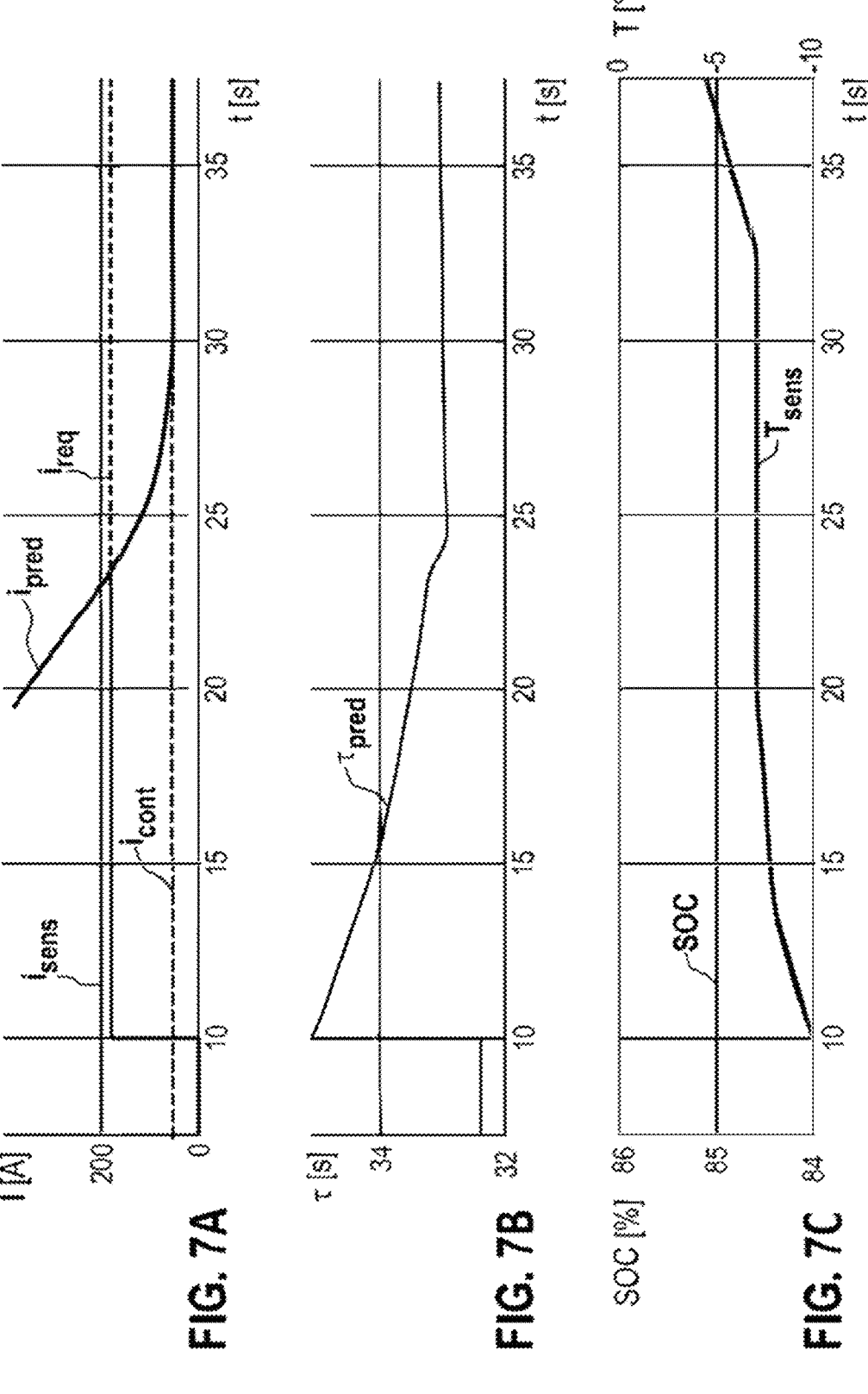
FIG. 7A shows a schematic representation of a temporal characteristic of a cell current $i_{req}$, with limitation of the RMS value $i_{RMS}$ thereof, according to a second example.
FIG. 7B shows a schematic representation of a temporal characteristic of a predictive time constant $\tau_{pred}$ according to FIG. 7A.
FIG. 7C shows a schematic representation of a temporal characteristic of a state of charge SOC and a temporal characteristic of a measured temperature $T_{sens}$ according to FIG. 7A.

FIG. 7A shows a schematic representation of a temporal characteristic of a cell current $i_{req}$, with limitation of the RMS value $i_{RMS}$ thereof, according to a second example, whereas FIG. 7B shows a schematic representation of a temporal characteristic of a predictive time constant $\tau_{pred}$ according to FIG. 7A, and FIG. 7C shows a schematic representation of a temporal characteristic of a state of charge SOC and a temporal characteristic of a measured temperature $T_{sens}$ according to FIG. 7A.

Temporal characteristics are represented for a relaxed battery cell 34 having an initial state of charge SOC of 85%. An initial temperature T of the battery cell 34 is –10° C. The battery cell 34 is charged with a cell current $i_{req}$ of 175 A for a time of 30 s. The state of charge SOC remains unchanged, whereas the measured temperature $T_{sens}$ rises during the duration of the current pulse.

From FIG. 7A, it can be seen that, at time point t=10 s, a current pulse, which represents the cell current $i_{req}$, having a measured value $i_{sens}$ of 175 A, is transmitted to the battery cell 34. The duration of the current pulse is 30 s. From the data sheet for the battery cell 34, it can be determined that a current pulse of 175 A at a temperature T of −10° C. and a state of charge of 85% is only permissible for 10 s. A predictive time constant $\tau_{pred}$ and a predictive RMS limiting value $i_{pred}$, which converges to a continuous current $i_{cont}$, are calculated. As the measured temperature $T_{sens}$ of the battery cell 34 varies over the duration of the current pulse, the predictive time constant $\tau_{pred}$ is calculated dynamically. From FIG. 7A, it can further be seen that the reduction of the current pulse commences somewhat later. The current pulse reduces to the continuous current $i_{cont}$. The continuous current $i_{cont}$ also adjusts to the temperature T.

Figure 8:
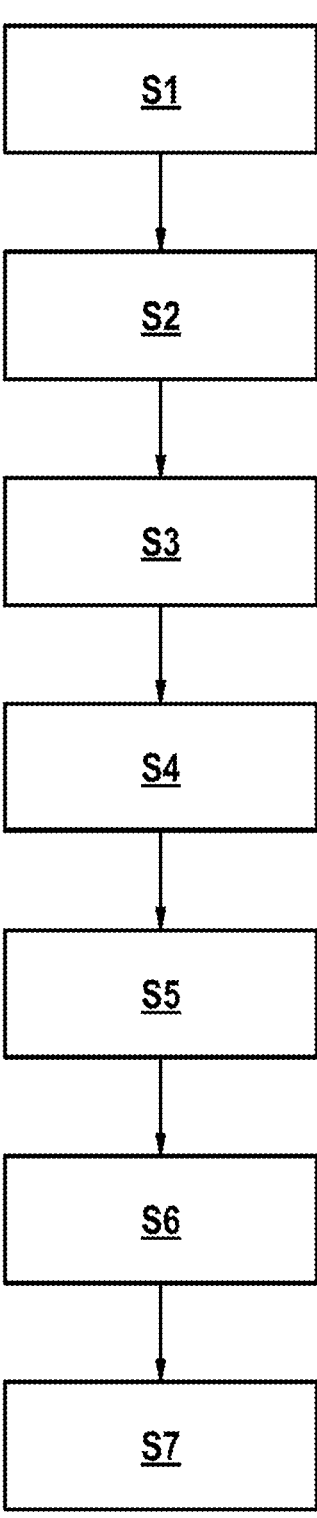
FIG. 8 shows a sequence for the method according to the invention.

FIG. 8 shows a sequence for the method according to the invention. In a step S1, for a measured temperature $T_{sens}$, quadratic reference currents $i_{ref}^2$ of a battery cell 34 are determined for different time intervals $t_{ref}$. For example, for a measured temperature $T_{sens}$ of 25° C., quadratic reference currents $i_{ref2s}^2$, $i_{ref10s}^2$, $i_{ref30s}^2$ are determined for the corresponding time intervals $t_{ref}$ of 2 s, 10 s and 30 s. If, for example, the temperatures T defined in the cell data sheet are 20° C. and 30° C., these quadratic reference currents $i_{ref2s}^2$, $i_{ref10s}^2$, $i_{ref30s}^2$ can be interpolated, if this is permitted by the cell data sheet.

In a step S2, for each reference current $i_{ref}$, a corresponding reference time constant $\tau_{ref}$ is calculated by the application of a model for the calculation of a RMS value $i_{RMS}$ of a cell current $i_{req}$ by reference to a continuous current $i_{cont}$, which corresponds to the minimum current in the charging or discharging device which causes no thermal damage. For example, if it proceeds from the cell data sheet that a current of 150 A is only permitted to last for 2 s, this current must then be permitted for 2 s or less. To this end, the reference time constant $\tau_{ref}$ is adjusted such that the limiting value for current is achieved at 2 s or earlier. For example, for the respective reference currents $i_{ref2s}$, $i_{ref10s}$ and $i_{ref30s}$, a corresponding reference time constant $\tau_{ref2s}$, $\tau_{ref10s}$ and $\tau_{ref30s}$ is calculated. The model is preferably configured in the form of a PT1-element.

In a step S3, by reference to the calculated reference time constants $\tau_{ref}$ and the quadratic reference currents $i_{ref}^2$ thus determined, a diagram is then constituted for the relationship between the reference time constant $\tau_{ref}$ and the quadratic reference current $i_{ref}^2$, for each specified temperature T.

In a step S4, a predictive time constant $\tau_{pred}$ is determined by the comparison of a quadratic measured value $i_{sens}^2$ of a cell current $i_{req}$ with the quadratic reference currents $i_{ref}^2$. If the quadratic measured value $i_{sens}^2$ of the cell current $i_{req}$ is equal to a quadratic reference current $i_{ref}^2$, the predictive time constant $\tau_{pred}$ is equal to the reference time constant $\tau_{ref}$ which corresponds to this reference current $i_{ref}$. Otherwise, the predictive time constant $\tau_{pred}$ is determined by interpolation.

In a step S5, a predictive RMS limiting value $i_{pred}$ of the cell current $i_{req}$ is calculated on the basis of the continuous current $i_{cont}$, a predictive time $t_{pred}$ and the predictive time constant $\tau_{pred}$. The predictive time $t_{pred}$ can be customer-specific.

In a step S6, on the basis of the predictive RMS limiting value $i_{pred}$, a first predictive limiting value $i_{predS}$ for a short predictive time $t_{predS}$, a second predictive limiting value $i_{predL}$ for a long predictive time $t_{predL}$ and a third predictive limiting value $i_{predP}$ for a continuous predictive time $t_{predP}$ are calculated. For example, a time of less than 2 s can be defined as a short predictive time $t_{predS}$. For example, a long predictive time $t_{predL}$ can be equal to 2 s, whereas a continuous predictive time $t_{predP}$ can be equal to 10 s.

In a step S7, an additional RMS limiting value $i_{limT}$ for the cell current $i_{req}$ is calculated by reference to a maximum permissible temperature $T_{max}$ of the battery cell 34 and the measured temperature $T_{sens}$ of the battery cell 34. This additional RMS limiting value $i_{limT}$ is employed for thermal derating. The continuous current $i_{cont}$ is limited by the additional RMS limiting value $i_{limT}$, and is reduced in the event of thermal derating.

The invention is not limited to the exemplary embodiments described herein and the aspects thereof indicated. Instead, within the field indicated by the claims, a plurality of variations are possible, which lie within the practice of a person skilled in the art.

The invention claimed is:

1. A method for controlling a cell current limiting value for a battery management system, comprising the following steps:

determination of quadratic reference currents $i_{ref}^2$ of a battery cell (34), at a measured temperature $T_{sens}$, for different time intervals $t_{ref}$;

calculation of a corresponding reference time constant $\tau_{ref}$ for each reference current $i_{ref}$ by the application of a model for the calculation of a RMS value $i_{RMS}$ of a cell current $i_{req}$ by reference to a continuous current $i_{cont}$, which corresponds to the minimum current in the charging or discharging device which causes no thermal damage;

constitution of a diagram for the relationship between the reference time constant $\tau_{ref}$ and the quadratic reference current $i_{ref}^2$, by reference to the calculated reference time constants $\tau_{ref}$ and the quadratic reference currents $i_{ref}^2$ determined for each specific temperature T;

determination of a predictive time constant $\tau_{pred}$ by the comparison of a quadratic measured value $i_{sens}^2$ of a cell current $i_{req}$ with the quadratic reference currents $i_{ref}^2$; and calculation of a predictive RMS limiting value $i_{pred}$ of the cell current $i_{req}$, on the basis of the continuous current $i_{cont}$, a predictive time $t_{pred}$ and the predictive time constant $\tau_{pred}$.

2. The method according to claim 1, wherein the model for the calculation of a RMS value $i_{RMS}$ of a cell current $i_{req}$ is configured in the form of a PT1-element.

3. The method according to claim 1, wherein the calculation of the predictive time constant $\tau_{pred}$ corresponding to the measured value $i_{sens}$ of the cell current $i_{req}$ is executed by linear interpolation.

4. The method according to claim 1, wherein, on the basis of the predictive RMS limiting value $i_{pred}$, a first predictive limiting value $i_{predS}$ for a short predictive time $t_{predS}$, a second predictive limiting value $i_{predL}$ for a long predictive time $t_{predL}$, and a third predictive limiting value $i_{predP}$ for a continuous predictive time $t_{predP}$ are calculated.

5. The method according to claim 1, wherein an additional RMS limiting value $i_{limT}$ for the cell current $i_{req}$ is calculated by reference to a maximum permissible temperature $T_{max}$ of the battery cell (34) and the measured temperature $T_{sens}$ of the battery cell (34).

6. The method according to claim 1, wherein a proportional-integral controller (32) is employed, having a proportionally-acting component and an integrally-acting component.

7. The method according to claim 6, wherein the proportional-integral controller (32) comprises an anti-windup structure and/or the integrally-acting component of the proportional-integral controller (32) is only activated in the event that the measured temperature $T_{sens}$ exceeds the maximum permissible temperature $T_{max}$ and/or if the measured temperature $T_{sens}$ exceeds a predefined temperature threshold value, and the RMS value $i_{RMS}$ of the cell current $i_{req}$ exceeds a predefined current threshold value.

8. A battery management systemconfigured to control a cell current limiting value for a battery management system, by:

determining quadratic reference currents $i_{ref}^2$ of a battery cell (34), at a measured temperature $T_{sens}$, for different time intervals $t_{ref}$;

calculating a corresponding reference time constant $\tau_{ref}$ for each reference current $i_{ref}$ by the application of a model for the calculation of a RMS value $i_{RMS}$ of a cell current $i_{req}$ by reference to a continuous current $i_{cont}$, which corresponds to the minimum current in the charging or discharging device which causes no thermal damage;

constituting a diagram for the relationship between the reference time constant $\tau_{ref}$ and the quadratic reference current $i_{ref}^2$, by reference to the calculated reference time constants $\tau_{ref}$ and the quadratic reference currents $i_{ref}^2$ determined for each specific temperature T;

determining a predictive time constant $\tau_{pred}$ by the comparison of a quadratic measured value $i_{sens}^2$ of a cell current $i_{req}$ with the quadratic reference currents $i_{ref}^2$; and calculating a predictive RMS limiting value $i_{pred}$ of the cell current $i_{req}$, on the basis of the continuous current $i_{cont}$, a predictive time $t_{pred}$ and the predictive time constant $\tau_{pred}$.

9. A battery having one or more battery cells (34), where in the battery is configured to control a cell current limiting value for a battery management system, by:

determining quadratic reference currents $i_{ref}^2$ of a battery cell (34), at a measured temperature $T_{sens}$, for different time intervals $t_{ref}$;

calculating a corresponding reference time constant $\tau_{ref}$ for each reference current $i_{ref}$ by the application of a model for the calculation of a RMS value $i_{RMS}$ of a cell current $i_{req}$ by reference to a continuous current $i_{cont}$, which corresponds to the minimum current in the charging or discharging device which causes no thermal damage;

constituting a diagram for the relationship between the reference time constant $\tau_{ref}$ and the quadratic reference current $i_{ref}^2$, by reference to the calculated reference time constants $\tau_{ref}$ and the quadratic reference currents $i_{ref}^2$ determined for each specific temperature T;

determining a predictive time constant $\tau_{pred}$ by the comparison of a quadratic measured value $i_{sens}^2$ of a cell current $i_{req}$ with the quadratic reference currents $i_{ref}^2$; and calculating a predictive RMS limiting value $i_{pred}$ of the cell current $i_{req}$, on the basis of the continuous current $i_{cont}$, a predictive time $t_{pred}$ and the predictive time constant $\tau_{pred}$.

10. A vehicle comprising a battery management system configured to determine quadratic reference currents $i_{ref}^2$ of a battery cell (34), at a measured temperature $T_{sens}$, for different time intervals $t_{ref}$;

calculate a corresponding reference time constant $\tau_{ref}$ for each reference current $i_{ref}$ by the application of a model for the calculation of a RMS value $i_{RMS}$ of a cell current $i_{req}$ by reference to a continuous current $i_{cont}$, which corresponds to the minimum current in the charging or discharging device which causes no thermal damage;

constitute a diagram for the relationship between the reference time constant $\tau_{ref}$ and the quadratic reference current $i_{ref}^2$, by reference to the calculated reference time constants $\tau_{ref}$ and the quadratic reference currents $i_{ref}^2$ determined for each specific temperature T;

determine a predictive time constant $\tau_{pred}$ by the comparison of a quadratic measured value $i_{sens}^2$ of a cell current $i_{req}$ with the quadratic reference currents $i_{ref}^2$, and calculate a predictive RMS limiting value $i_{pred}$ of the cell current $i_{req}$, on the basis of the continuous current $i_{cont}$, a predictive time $t_{pred}$ and the predictive time constant $\tau_{pred}$.

\* \* \* \* \*